United States Patent
Purtell et al.

(10) Patent No.: US 7,417,290 B2
(45) Date of Patent: Aug. 26, 2008

(54) AIR BREAK FOR IMPROVED SILICIDE FORMATION WITH COMPOSITE CAPS

(75) Inventors: Robert J. Purtell, Mohegan Lake, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/306,719

(22) Filed: Jan. 9, 2006

(65) Prior Publication Data

US 2007/0161240 A1      Jul. 12, 2007

(51) Int. Cl.
*H01L 29/76* (2006.01)
*H01L 21/44* (2006.01)

(52) U.S. Cl. .................. 257/410; 438/682; 438/664; 257/E21.165; 257/E21.166; 257/755

(58) Field of Classification Search ................ 438/664, 438/655, 683, 660, 682; 257/E21.166, E21.177, 257/E21.165, 755, 410, E26.161, E29.143
See application file for complete search history.

(56) References Cited

U.S. PATENT DOCUMENTS

| | | | |
|---|---|---|---|
| 4,092,448 A | 5/1978 | Coll-Palagos | 427/383 |
| 4,673,968 A * | 6/1987 | Hieber et al. | 257/388 |
| 5,672,543 A | 9/1997 | Chang et al. | |
| 5,766,997 A | 6/1998 | Takeuchi | |
| 5,869,379 A | 2/1999 | Gardner et al. | 438/305 |
| 6,136,705 A | 10/2000 | Blair | |
| 6,221,231 B1 | 4/2001 | Foster | 205/192 |
| 6,344,411 B1 | 2/2002 | Yamada et al. | |
| 6,388,327 B1 | 5/2002 | Giewont et al. | |

(Continued)

FOREIGN PATENT DOCUMENTS

EP        0898306 A2        2/1999

OTHER PUBLICATIONS

PCT International Search Report (Form PCT/ISA/220), dated May 4, 2007, for International Application No. PCT/EP2007/050175, 5 pages.

(Continued)

*Primary Examiner*—Caridad M Everhart
(74) *Attorney, Agent, or Firm*—Gibb & Rahman, LLC; Joseph Abate, Esq.

(57) ABSTRACT

Disclosed is a structure and method for tuning silicide stress and, particularly, for developing a tensile silicide region on a gate conductor of an n-FET in order to optimize n-FET performance. More particularly, a first metal layer-protective cap layer-second metal layer stack is formed on an n-FET structure. However, prior to the deposition of the second metal layer, the protective layer is exposed to air. This air break step alters the adhesion between the protective cap layer and the second metal layer and thereby, effects the stress imparted upon the first metal layer during silicide formation. The result is a more tensile silicide that is optimal for n-FET performance. Additionally, the method allows such a tensile silicide region to be formed using a relatively thin first metal layer-protective cap layer-second metal layer stack, and particularly, a relatively thin second metal layer, to minimize mechanical energy build up at the junctions between the gate conductor and the sidewall spacers to avoid silicon bridging.

10 Claims, 6 Drawing Sheets

U.S. PATENT DOCUMENTS

| | | |
|---|---|---|
| 6,471,848 B1 | 10/2002 | Arao et al. .................. 205/220 |
| 6,500,759 B1 * | 12/2002 | Asakawa .................... 438/683 |
| 2004/0266213 A1 | 12/2004 | Li et al. ...................... 438/770 |
| 2005/0037585 A1 | 2/2005 | Park et al. .................. 438/305 |
| 2005/0156208 A1 | 7/2005 | Lin et al. |
| 2005/0255699 A1 | 11/2005 | Jones et al. ................. 438/683 |

OTHER PUBLICATIONS

U.S. Appl. No. 10/905,949, filed Jan. 27, 2005, entitled "Silicide Cap Structure and Process for Reduced Stress and Improved Gate Sheet Resistance".

* cited by examiner

US 7,417,290 B2

AIR BREAK FOR IMPROVED SILICIDE FORMATION WITH COMPOSITE CAPS

BACKGROUND OF THE INVENTION

1. Field of the Invention

The invention generally relates to silicide formation processes, and, more particularly, to a structure and method for simultaneously tuning silicide stress and controlling silicon bridging during a self-aligned silicide formation process.

2. Description of the Related Art

As complementary metal oxide semiconductor devices are scaled and, particularly, as channel lengths are scaled, parasitic resistance in such devices increases. To minimize parasitic resistance, silicide regions are formed on polysilicon gate conductors, on silicon source/drain diffusion areas and also as a local interconnects between devices (e.g., between a silicon source/drain diffusion area of one device and the polysilicon gate conductor of another device). These silicide regions provide low resistance and are able to withstand high temperatures. Thus, they can be used to improve CMOS device speed and, therefore, performance.

During a conventional self-aligned silicide formation process, a metal layer (e.g., a 6-10 nm nickel, titanium or cobalt layer) is deposited over a device structure (e.g., over a field effect transistor formed on a semiconductor wafer such as a silicon-on-insulator (SOI) wafer). Specifically, the metal layer can be deposited over the silicon source/drain diffusion areas, over the polysilicon gate conductor and over the sidewall spacers that are adjacent to the gate conductor. This step is followed by the deposition of a protective cap layer (e.g., titanium nitride) that prevents contamination of the metal layer during subsequent thermal anneals. A first anneal is applied to form silicide regions at the silicon-metal interfaces, including the polysilicon-metal interfaces, in a thermal reaction that results in a significant volume change. Then, the protective cap layer and the remaining metal are removed. A second thermal anneal can be applied to transform any silicides in metal rich phases into monosilicides.

Several factors should be considered during the silicide formation process to ensure optimal CMOS device performance. First, the process should avoid bridging of silicon into unwanted areas to prevent shorts. For example, since there is a significant volume change when metal thermally reacts with silicon to form metal silicide, a protective cap layer with limited flexibility may allow voids to open up to compensate for the volume changes. Such voids can allow silicon to move or bridge into unwanted areas of the device (e.g., over sidewall spacers) and, thus, potentially impair device performance. Second, CMOS device performance can be optimized by tuning the tensile or compressive stress of the silicide regions as they are formed. For example, a more tensile silicide will place the silicon or polysilicon underlayers in compression and, thus, in a better state for n-type field effect transistor (n-FET) performance. Alternatively, a more compressive silicide will place the silicon or polysilicon underlayers in tension and, thus, in a better state for p-FET performance. Consequently, there is a need for a structure and method for simultaneously controlling silicon bridging and tuning silicide stress during a self-aligned silicide formation process.

SUMMARY OF THE INVENTION

In view of the foregoing disclosed are embodiments of a self-aligned silicide formation method and an associated structure used in conjunction with the method.

More particularly, an embodiment of the self-aligned silicide formation method comprises forming a first metal layer (e.g., an approximately 9 nm nickel layer) on an n-type field effect transistor (n-FET) that is formed on a semiconductor wafer, such as a bulk silicon or an SOI wafer. Specifically, the first metal layer can be deposited in a vacuum over the a polysilicon gate conductor, over sidewall spacers adjacent to the gate conductor, over silicon source/drain diffusion areas, and over shallow trench isolation regions adjacent to the source/drain diffusion areas. A protective cap layer (e.g., an approximately 3 nm titanium nitride layer) can then be formed (e.g., deposited in a vacuum) over the first metal layer to protect the first metal layer from contaminates during subsequent anneals. The protective layer can be formed such that it is only approximately ⅓ as thick as the first metal layer.

After the protective cap layer is deposited, the device is subjected to an air break. Specifically, the wafer on which the device is formed is removed from the deposition chamber for a predetermined period of time (e.g., a period of time greater than 1 minute). Removing the wafer from the deposition chamber exposes the top surface of the protective layer to air which presumably has the effect of introducing oxygen and/or water vapor into or onto the protective cap layer.

Once the predetermined period of time has elapsed, a second metal layer (e.g., a second approximately 3 nm nickel layer) is formed (e.g., deposited in a vacuum) on the top surface of the protective layer. The second metal layer can be formed such that is has approximately the same thickness as the protective layer. Additionally, the first metal layer-protective layer-second metal layer stack can be formed such that it has a preselected combined thickness designed to minimize mechanical energy build up at any uneven junctions between silicon bodies and adjacent insulators (e.g., at the junctions between the gate conductor and the sidewall spacers). Specifically, a combined first metal layer-protective layer-second metal layer stack thickness of less than approximately 20 nm is optimal for avoiding void formation and silicon bridging across silicon-insulator junctions during the self-aligned silicide formation process.

After the first metal layer-protective layer-second metal layer stack is formed, a first anneal process is performed so as to form tensile silicide regions at the silicon-metal interfaces. Specifically, the contamination of the top surface of the protective layer with oxygen and/or moisture effects the adhesion properties between the protective layer and the second metal layer and, thus, alters the external mechanical stress that is exerted upon the silicide as it is formed. More particularly, a protective layer-second metal layer stack that is formed using an air break imparts a more tensile stress on the first metal layer during the anneal process than would a similar stack formed with the same layers having the same thicknesses but without the air break. The resulting silicide region is tensile as opposed to compressive (e.g., the resulting silicide region can be formed with a tensile stress that is greater than approximately $+2.00 \times 10^9$ dynes/cm$^2$). This tensile silicide region will compress the underlying silicon body (e.g., the polysilicon gate conductor) so as to optimize performance of the n-FET.

An embodiment of a structure for forming a tensile silicide region on at least one silicon body (e.g., a polysilicon gate conductor and the silicon source/drain diffusion areas) of an n-FET is also disclosed. The structure comprises a first metal layer (e.g., an approximately 9 nm nickel layer) that is deposited on n-FET structure (i.e., deposited over the silicon bodies and any adjacent insulators (e.g., sidewall spacers, shallow trench isolation regions, etc.). Above the first metal layer is a protective layer (e.g., an approximately 3 nm titanium nitride layer that is approximately ⅓ the thickness of the first metal layer). The protective layer has a contaminated top surface. Specifically, the protective layer has a top surface that is contaminated with oxygen and/or moisture. Adhered to the contaminated top surface of the protective layer is a second metal layer (e.g., an approximately 3 nm second nickel layer that is approximately the same thickness as the protective layer). The combined thickness of the first metal layer-protective layer-second metal layer stack is preselected (e.g., to be less than approximately 20 nm) so as to minimize mechanical energy build up in the structure at uneven silicon-insulator junctions. Thus, the structure avoids void formation and silicon bridging across the silicon-insulator junctions during the silicide formation process. Additionally, as a result of an anneal process applied to the structure a tensile silicide region is formed at the silicon-metal interfaces. Specifically, an anneal process applied to a structure formed as described above will result in silicide regions with a tensile stress that is greater than approximately +2.00×10$^9$ dynes/cm$^2$ being formed above the silicon bodies (i.e., above the polysilicon gate conductor and the source/drain diffusion areas) of the n-FET. This tensile silicide region will compress the silicon so as to optimize performance of the transistor.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 5D-5E illustrate an embodiment of the structure of the invention incorporated into the processing steps of FIG. 4.

DETAILED DESCRIPTION OF THE PREFERRED EMBODIMENTS OF THE INVENTION

Figure 1A:
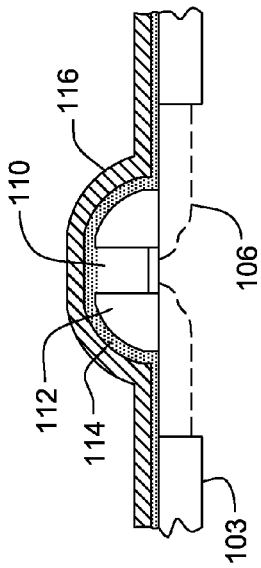
FIGS. 1A-D are cross-sectional view schematic diagrams illustrating self-aligned silicide formation processing steps.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 1B:
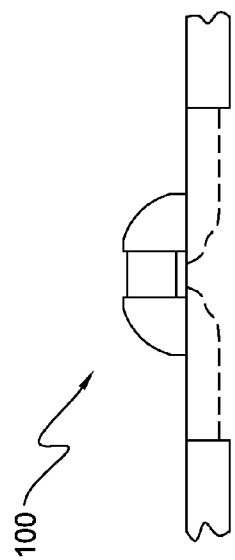
Figure 1C:
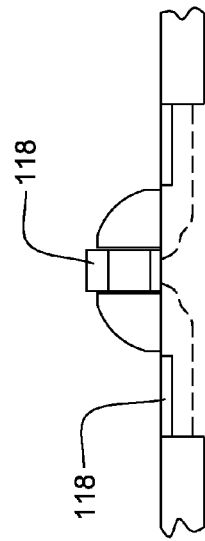
Figure 1D:
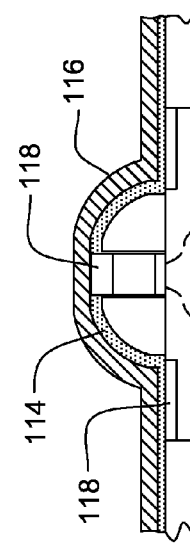

As mentioned above, there is a need for a structure and method for simultaneously tuning silicide stress and controlling silicon bridging during a self-aligned silicide formation process. Referring to FIGS. 1A-1B, during a conventional self-aligned silicide formation process, a metal layer 114 (e.g., a 6-10 nm nickel, titanium or cobalt layer) is deposited in a vacuum over a metal oxide semiconductor (MOS) device 100 (e.g., over a field effect transistor formed on a semiconductor wafer such as a silicon-on-insulator (SOI) wafer or a bulk silicon wafer). Specifically, the metal layer 114 can be deposited over the silicon source/drain diffusion areas 106, over the polysilicon gate conductor 110, over the sidewall spacers 112 (e.g., oxide or nitride spacers) that are adjacent to the gate conductor 110, and over shallow trench isolation structures 103 (STIs) that are adjacent to the source/drain diffusion areas 106. This step is followed by the deposition, also in a vacuum, of a protective cap layer 116 (e.g., a titanium nitride layer) that prevents contamination of the metal layer 114 during subsequent thermal anneals. A first anneal is applied to form silicide regions 118 (e.g., cobalt, nickel or titanium silicides) at the silicon-metal interfaces, including the polysilicon-metal interfaces, in a thermal reaction that results in a significant volume change (see FIG. 1C). Then, the protective cap layer 116 and the remaining metal 114 are removed (see FIG. 1D). A second thermal anneal can be applied to transform any silicides 118 in metal rich phases into monosilicides.

An alternative silicide formation method is described in U.S. patent application Ser. No. 10/709,534, filed on May 12, 2004, and incorporated herein by reference. The described method is designed to control voiding and silicon bridging during silicide formation. Specifically, due volume changes during the silicide formation process, a protective cap with limited flex will allow voids to open up. Such voids can allow silicon to move into undesireable areas (e.g., over sidewalls spacers) resulting in electrical bridging which potentially can impair device performance. The alternative method forms a counter stress layer (e.g, a cobalt layer)-titanium nitride-metal layer stack over a FET. Then, an anneal process is performed to form the silicide at the silicon-metal interfaces. The net stored energy in the resulting silicide/titanium nitride/cobalt film is reduced, thereby, preventing void formation that could otherwise lead to bridging.

Figure 2:
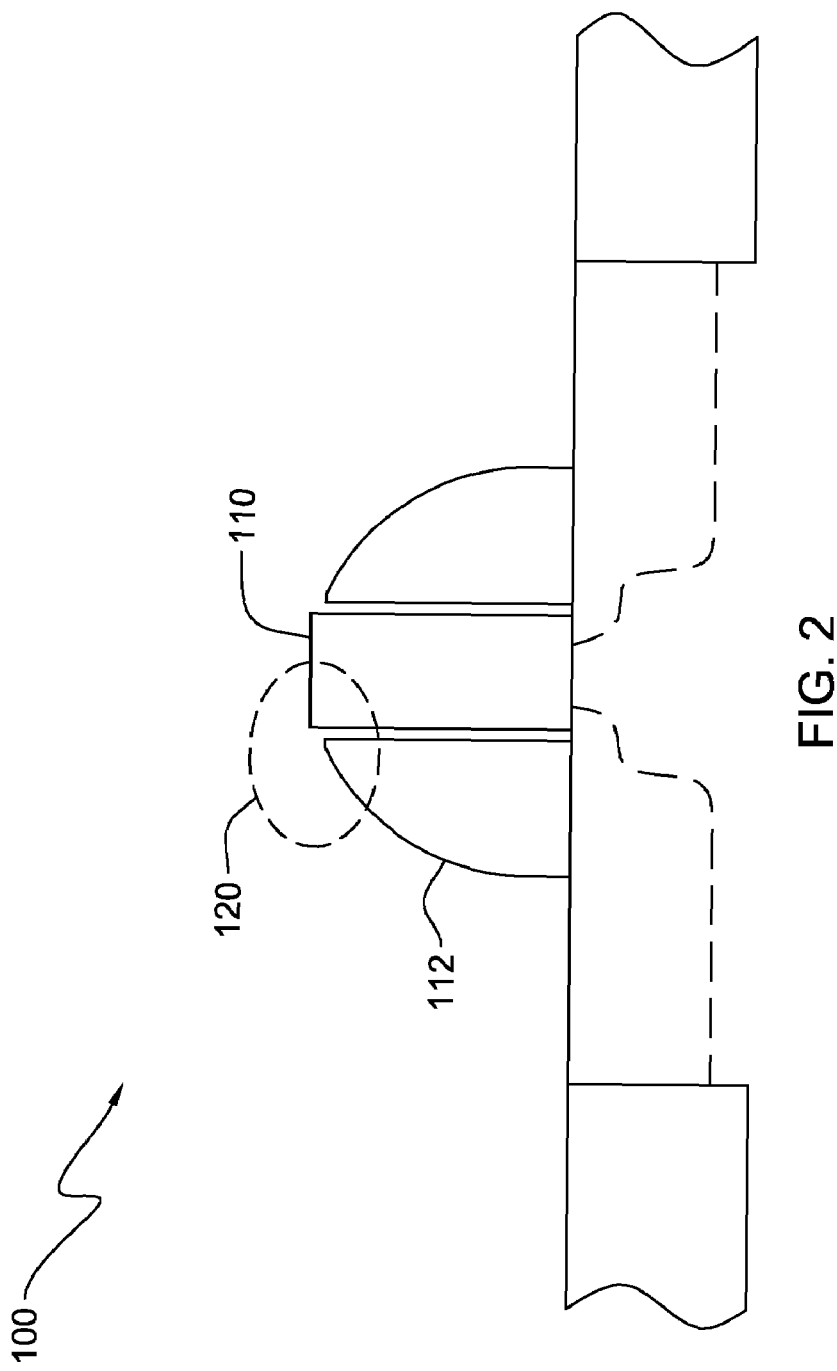
FIG. 2 is a cross-sectional view schematic diagram illustrating exemplary uneven junctions between polysilicon gate conductors and sidewall spacers of a field effect transistor.
Figure 3:
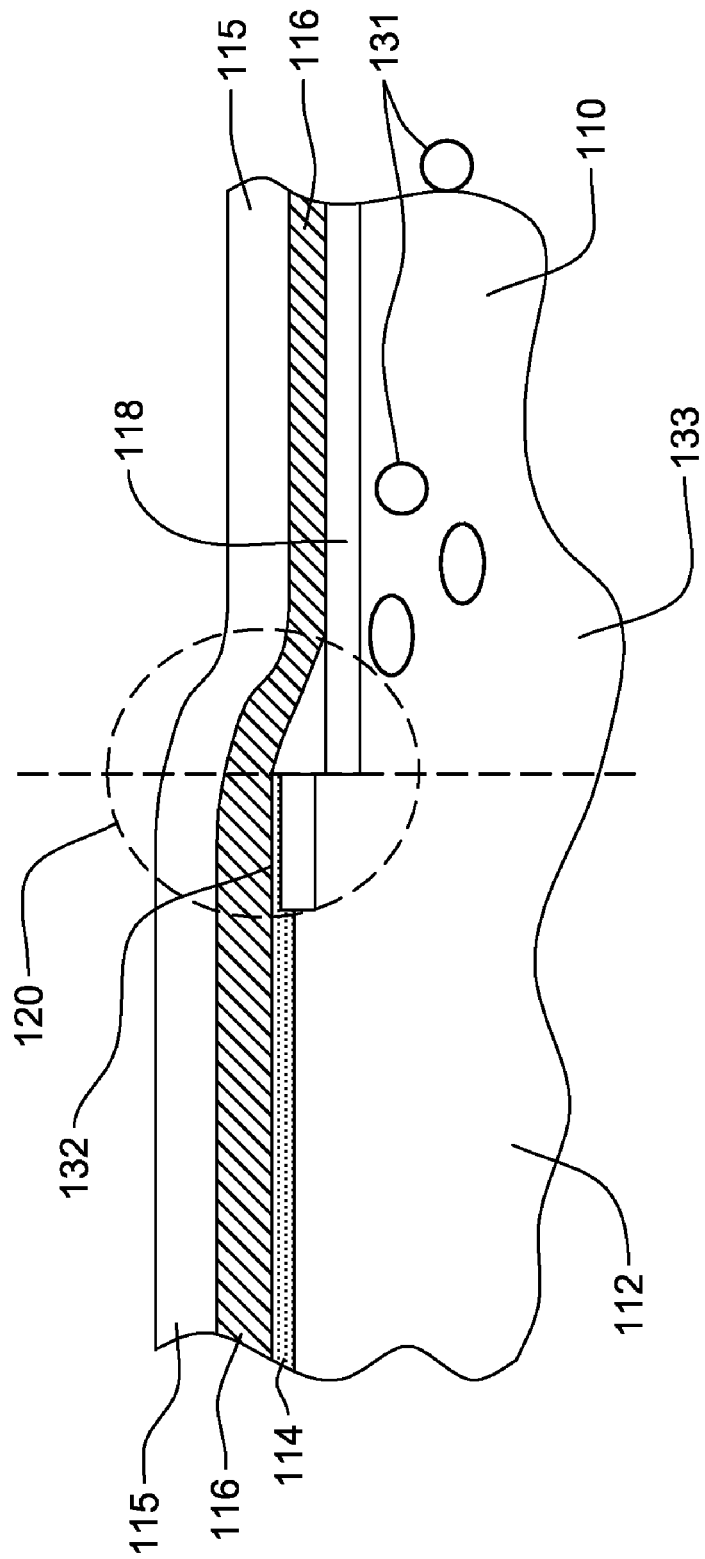
FIG. 3 is a cross-sectional view schematic diagram illustrating potential voids and silicon bridging across junctions between silicon bodies and insulators during self-aligned silicide formation.

As mentioned above, CMOS device performance can be optimized by tuning the tensile or compressive stress of the silicide regions as they are formed. For example, a more tensile silicide will place the silicon or polysilicon underlayers in compression and, thus, in a better state for n-type field effect transistor (n-FET) performance. Alternatively, a more compressive silicide will place the silicon or polysilicon underlayers in tension and, thus, in a better state for p-FET performance. Using the above-mentioned alternative method for silicide formation, a relatively thick counter stress layer is needed to lower the compressive stress of the first metal layer/protective cap layer stack in order to ultimately provide a more tensile silicide that is optimal for n-FET performance. However, referring to FIG. 3, a thick counter stress layer 115 creates problems in mechanical energy build up around sharp structures of the device 100, such as in uneven junctions 120 between the polysilicon gate conductor 110 and the sidewall spacers 112 (see FIG. 2). Specifically, the titanium nitride cap 116 must deflect over active areas 110 during silicide formation without deflecting over insulators 112. The distance it has to travel is a function of the metal thickness and the silicide phase that is formed during the anneal process. Mechanical energy ($E_{def}$) that is built up during this deflection can be determined using the following formula:

$$E_{def} = \int (EI) k^2 dt \sim Et^3$$

where E is Young's modulus I is the bending moment of inertia, k is the curvature of the film, t is the film thickness, and $E_{def}$ is the energy stored in the film. As the combined thickness of the first metal layer 114-protective cap layer 116-counter stress layer 125 stack increases, so does the mechanical energy required to wrap that stack around sharp edges, such as into the uneven junction 120 between the sidewall spacers 112 and the gate conductor 110. As the mechanical energy increase so does the stress build up in the silicide 118 creating voids 131 which can lead to silicon overgrowth 133 and silicide 132 bridging over unwanted areas (e.g., the sidewall spacers 112, STIs, etc.). Thus, n-FET performance is difficult to improve. Also, the rate of counter stress with the in-situ dep nickel is not very high with the nickel thickness. A tensile stress cap may not even be obtainable with a densely packed transition gate design.

In view of the foregoing disclosed is a structure and method for tuning silicide stress during a self-aligned silicide formation process and, particularly, for developing a tensile silicide region on a gate conductor of an n-FET in order to optimize n-FET performance. The structure and method can also simultaneously control silicon bridging during the silicide formation process.

Figure 4:
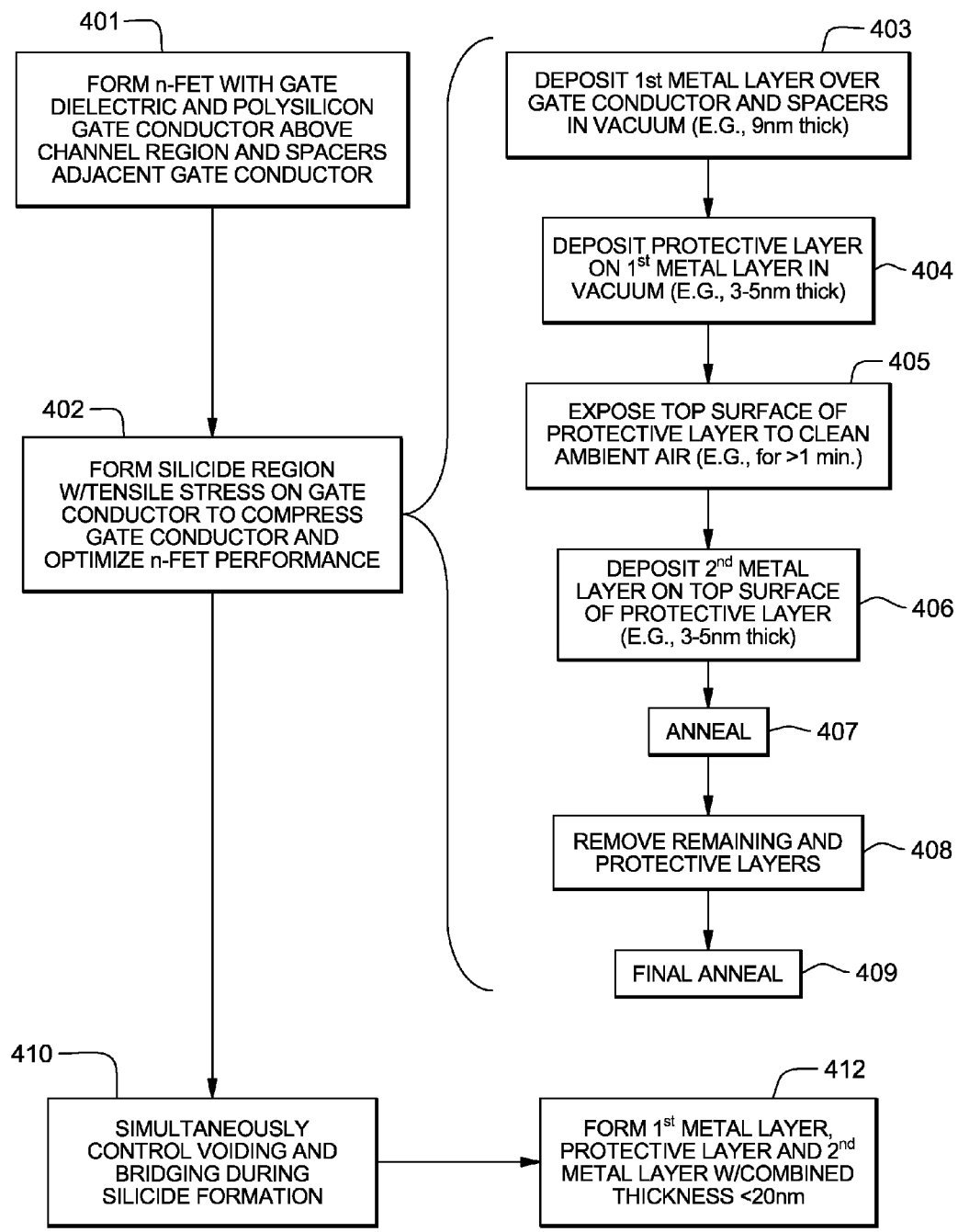
FIG. 4 is a flow diagram illustrating an embodiment of the method of the invention.

Referring to FIG. 4, an embodiment of a self-aligned silicide formation method comprises forming an n-FET 500. For example, the n-FET 500 may be formed with highly doped (N+) silicon source/drain diffusion area 506, a channel region disposed between the source/drain diffusion areas 506, a gate dielectric above the channel region, a polysilicon gate conductor 510 above the gate dielectric and insulating (e.g., oxide or nitride) sidewall spacers 512 adjacent to the polysilicon gate conductor 510 (401, see FIG. 5A). A silicide region with a tensile stress of greater than approximately +2.00×10$^9$ dynes/cm$^2$ is then formed on the polysilicon gate conductor in order to compress the gate conductor and, thereby, optimize the performance of the n-FET 500 (402). Simultaneously, silicon bridging across silicon-insulator junctions during the silicide formation process is minimized by limiting the combined thickness of the metal layer-protective cap layer-metal layer stack that is used to form the silicide in order to control voiding (410-412).

Figure 5B:
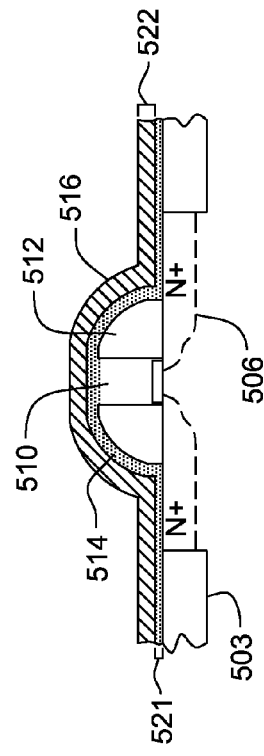
FIGS. 5A-F are cross-sectional view schematic diagrams illustrating processing steps of FIG. 4 and, specifically.
Figure 5A:
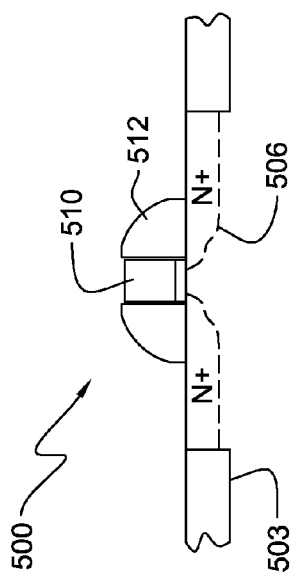

More particularly, a first metal layer 514 can be formed on over an n-type field effect transistor (n-FET) 500 that is formed on a semiconductor wafer (e.g., an SOI wafer) (403, see FIG. 5B). The first metal layer 514 can comprise a cobalt, nickel or titanium layer with a thickness 521 of approximately 6-10 nm. For example, an approximately 9 nm nickel layer 514 can be deposited in a vacuum over the n-FET 500 and, particularly, over the polysilicon gate conductor 510 (i.e., a silicon body), over sidewall spacers 512 (i.e., an insulator) adjacent to the gate conductor 510, over silicon source/drain diffusion areas 506 of the n-FET (i.e., another silicon body) and over shallow trench isolation regions 503 (i.e., another insulator) adjacent to the source/drain diffusion areas 506. A protective cap layer 516 can then be formed over the first metal layer 514 to protect the first metal layer 514 from contaminates during subsequent anneals (404, see FIG. 5B). The protective cap layer 516 can comprise a titanium nitride layer with a thickness 522 of 3-9 nm. For example, an approximately 3 nm titanium nitride layer 516 can be deposited in a vacuum over the approximately 9 nm first nickel layer 514 so that the thickness 521 of the titanium nitride layer 516 is only approximately ⅓ as thick as that of the first nickel layer 514.

After the protective cap layer 516 is deposited (at process 404), the device 500 is subjected to an air break (405). Specifically, the wafer on which the device 500 is formed is removed from the deposition chamber for a predetermined period of time (e.g., a period of time greater than 1 minute). Removing the wafer from the deposition chamber exposes the top surface 525 of the protective cap layer 516 to air 540 and, thus, presumably has the effect of introducing contaminates 517 (i.e., adventitious materials), such as oxygen and/or water vapor, into or onto the protective cap layer 516 (see FIG. 5C).

Figure 5D:
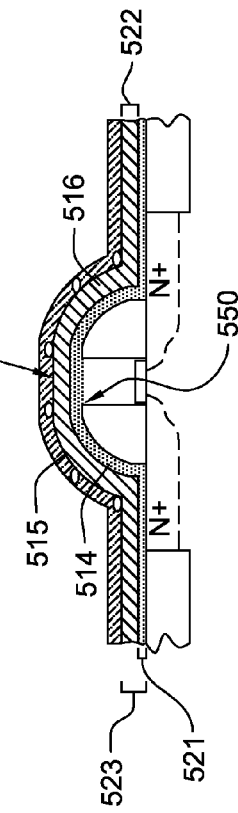
Figure 5C:
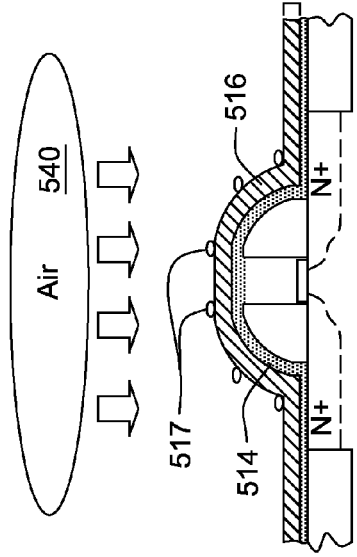

Once the predetermined period of time has elapsed, a second metal layer 515 is formed on the top surface 525 of the protective layer 516 (406, see FIG. 5D). The second metal layer 515 can comprise another nickel layer (or possibly, a cobalt or titanium layer) with a 3-10 nm thickness. For example, the wafer can be reloaded into the deposition tool and an approximately 3 nm nickel layer 515 can be deposited in a vacuum over the protective layer 516 so that the second metal layer 515 and the protective layer 514 have approximately the same thickness 522. However, those skilled in the art will recognize that the second metal layer 515 can be formed approximately 1 to 5 times thicker than the protective cap layer 516 in order to increase the mechanical stress exerted upon the first metal layer 514 without causing poor silicide formation.

Additionally, the first metal layer-protective layer-second metal layer stack can be formed such that it has a preselected combined thickness 523 designed to minimize mechanical energy build up at any uneven junctions 550 between silicon bodies (e.g, the polysilicon gate conductor 510) and adjacent insulators (e.g., the sidewall spacers 512) (410-420, See FIG. 5D). Specifically, a combined first metal layer-protective layer-second metal layer stack thickness 523 of less than approximately 20 nm is optimal for avoiding void formation and silicon bridging across silicon-insulator junctions 550 during the self-aligned silicide formation process.

Figure 5E:
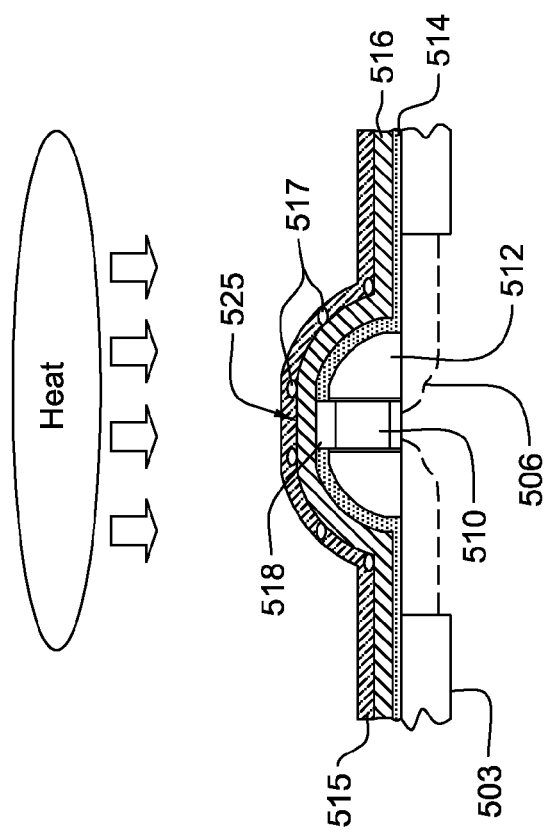

After the first metal layer-protective layer-second metal layer stack is formed (at process 406), a first high-temperature thermal anneal process is performed so as to form a tensile silicide regions 518 on silicon bodies 510, 506 at silicon-metal interfaces (407, see FIG. 5E). Specifically, exposing the top surface 525 of the protective cap layer 516 to air 540 presumably has the effect of introducing contaminates 517 (i.e., adventitious materials), such as oxygen and/or water vapor, into or onto the protective cap layer 516. This alters the adhesion properties between the protective layer 516 and the second metal layer 515 and, thus, alters the mechanical stress in the first metal layer-protective layer-second metal layer stack. Altering the mechanical stress in the stack in turn alters the external mechanical stress exerted upon the silicide 518 as it is formed and, thereby, allows a more tensile silicide region to be formed. The dramatic effect of the air break (at process 405) on the mechanical stress may be attributed to the different grain structure of the second metal layer 515 on the top surface 525 of the protective layer 516.

More particularly, the protective layer-second metal layer stack formed, as described above, with a contaminated top surface 525 of the protective layer 516 imparts a lower compressive stress on the first metal layer 514 during the anneal process than would a similar stack formed with the same layers having the same thicknesses but without the contaminated top surface. The resulting silicide region is tensile (e.g., with a tensile stress that is greater than approximately $+2.00\times 10^9$ dynes/cm$^2$) as opposed to compressive. For example, a 9 nm nickel layer with a 3 nm titanium nitride cap alone may result in a silicide region with a compressive stress of approximately $-7.69\times 10^9$ dynes/cm$^2$. If a 3 nm second nickel layer is added to the structure without providing an air break the compressive stress can be lowered to a still compressive approximately $-3.65\times 10^9$ dynes/cm$^2$. As discussed above, a lower compressive stress can be achieved by further increasing the thickness of the second metal layer. However, this technique also increases the likelihood of silicon bridging due to the increase in mechanical stress. Alternatively, using the method disclosed herein, if a 3 nm second nickel layer is added to the 9 nm nickel layer $-3$ nm titanium nitride layer stack following an air break, the silicide stress can be change to a tensile +5.46 dynes/cm$^2$. Thus, if the silicon body is a polysilicon gate conductor 510 of an n-type field effect transistor 500, the tensile silicide region 518 will compress the polysilicon gate conductor 510 and, thereby, optimize performance of the transistor once completed.

Figure 5F:
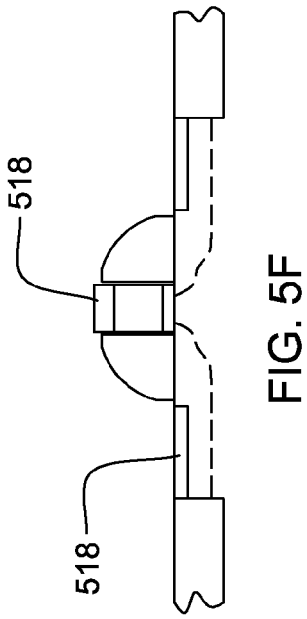

Once the silicide region 518 is formed the remaining metal layers 514 and 515 as well as the protective layer 516 can be removed (e.g., by a selective etching process) (408, see FIG. 5F). Additionally, if the silicide formed as a result of the first high temperature thermal anneal (at process 407) is in a metal rich phase and final high temperature thermal anneal may be performed in order to transform the silicide regions 518 into monosilicide regions.

Those skilled in the art will recognize that the above method may be use in conjunction with forming n-FETs alone or complementary metal oxide semiconductor (CMOS) devices that incorporate both n-FETs and p-FETs. As discussed above, the performance of an n-FET can be optimized with a tensile silicide region above the gate conductor and the performance of a p-FET can be optimized with a compressive silicide region above the gate conductor. This can be accomplished by providing the p-FET etching off material from the n-FET and/or by blocking material formation on the p-FET at one or more stages during CMOS silicide formation process. For example, p-FET performance may be improved by providing a thicker (20-60 nm thick) titanium nitride cap on the p-FET. N-FET performance may further be improved by providing a thinner titanium nitride cap and a thicker second metal layer.

Referring to FIGS. 5D-5E, in light of the embodiment of the method described above, an embodiment of a structure for forming a silicide region 518 on at least one silicon body (e.g., a polysilicon gate conductor 510 or silicon source/drain diffusion areas 506) that is adjacent to at least one insulator (e.g., sidewall spacers 512 adjacent to the gate conductor or STIs 503 adjacent to the source/drain diffusion areas) is also disclosed. The structure comprises a first metal layer 514 with a 6-10 nm thickness. For example, the first metal layer can comprise an approximately 9 nm nickel, cobalt or titanium layer. Above the first metal layer 514 is a protective layer 516 with a 3-9 nm thickness 522. For example, the protective layer 516 can comprise an approximately 3 nm titanium nitride layer that is approximately ⅓ the thickness 522 of the first metal layer 514. The protective layer 516 further comprises a contaminated top surface 525. Specifically, the protective layer 516 is exposed to air 540 during the formation process and, thus, the top surface 525 of the protective layer presumably comprises contaminates such as oxygen and/or water vapor 517. Adhered to the contaminated top surface 525 of the protective layer 516 is a second metal layer 515 that is approximately 1 to 5 times thicker than said protective cap layer 516 (e.g., approximately 3-10 nm thick). For example, the second metal layer can comprise an approximately 3 nm second nickel, cobalt or titanium layer that is approximately the same thickness 522 as the protective layer 516. The combined thickness 523 of the structure (i.e., the first metal layer 514-protective layer 516-second metal layer 515 stack) is preselected (e.g., to be less than approximately 20 nm) so as to minimize mechanical energy build up in the structure at uneven junctions 550 between the silicon body 510, 506 and the insulator 512, 502. Thus, the structure avoids void formation and silicon bridging at the silicon-insulator junctions 550 during the silicide formation process. Additionally, as a result of high temperature thermal anneal process applied to the structure a tensile silicide region 518 is formed on the silicon body 510, 506. Specifically, the anneal process applied to a structure formed as described above will result in a silicide region 518 with a tensile stress that is greater than approximately $+2.00\times 10^9$ dynes/cm$^2$ being formed above the silicon bodies (i.e., the polysilicon gate conductor 510 and the source/drain diffusion areas 506) of the n-FET. This tensile silicide region 518 will compress the silicon bodies and, particularly, the gate conductor 510 so as to optimize performance of the n-FET once completed.

Therefore, disclosed above is a structure and method for tuning silicide stress and, particularly, for developing a tensile silicide region on a gate conductor of an n-FET in order to optimize n-FET performance. More particularly, a first metal layer-protective cap layer-second metal layer stack is formed on an n-FET structure. However, prior to the deposition of the second metal layer, the protective layer is exposed to air. This air break step alters the adhesion between the protective cap layer and the second metal layer and thereby, effects the stress imparted upon the first metal layer during silicide formation. The result is a more tensile/less compressive silicide, optimal for n-FET performance. Additionally, the method allows such a tensile silicide region to be formed using a relatively thin first metal layer-protective cap layer-second metal layer stack, and particularly, a relatively thin second metal layer, to minimize mechanical energy build up at the junctions between the gate conductor and the sidewall spacers to avoid silicon bridging.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. A structure for forming a silicide region on a silicon body, said structure comprising:
    a first metal layer on said silicon body;
    a protective layer on said first metal layer, wherein said protective layer has a contaminated top surface; and
    a second metal layer adhered to said contaminated top surface, wherein as a result of an anneal applied to said structure a tensile silicide region is formed on said silicon body,
    wherein said silicon body comprises a polysilicon gate conductor of an n-type field effect transistor and wherein said tensile silicide region compresses said gate conductor so as to optimize performance of said transistor.

2. The structure of claim 1, all the limitations of which are incorporated herein by reference, wherein said contaminated top surface alters a mechanical stress exerted upon said first metal layer by said protective layer and said second metal layer during said anneal.

3. The structure of claim 1, all the limitations of which are incorporated herein by reference, wherein said second metal layer is approximately 1 to 5 times thicker than said protective layer.

4. The structure of claim 1, all the limitations of which are incorporated herein by reference, wherein said second metal layer is approximately ⅓ as thick as said first metal layer.

5. A structure for forming a silicide region on a silicon body that is adjacent to an insulator, said structure comprising:
 a first metal layer on said silicon body and said insulator;
 a protective layer on said first metal layer, wherein said protective layer has a contaminated top surface; and
 a second metal layer adhered to said contaminated top surface, wherein a combined thickness of said structure is preselected to minimize mechanical energy build up in said structure at uneven junctions between said silicon body and said insulator and wherein as a result of an anneal applied to said structure a tensile silicide region is formed on said silicon body.

6. The structure of claim 5, all the limitations of which are incorporated herein by reference, wherein said silicon body comprises a polysilicon gate conductor of an n-type field effect transistor and wherein said tensile silicide region compresses said gate conductor so as to optimize performance of said transistor.

7. The structure of claim 5, all the limitations of which are incorporated herein by reference, wherein said combined thickness is less than approximately 20 nm.

8. The structure of claim 5, all the limitations of which are incorporated herein by reference, wherein said contaminated top surface alters a mechanical stress exerted upon said first metal layer by said protective layer and said second metal layer during said anneal.

9. The structure of claim 5, all the limitations of which are incorporated herein by reference, wherein said second metal layer is approximately 1 to 5 times thicker than said protective layer.

10. The structure of claim 5, all the limitations of which are incorporated herein by reference, wherein said second metal layer is approximately ⅓ as thick as said first metal layer.

* * * * *